(12) United States Patent
Sakaizawa et al.

(10) Patent No.: US 9,039,452 B2
(45) Date of Patent: May 26, 2015

(54) CONNECTING DEVICE

(71) Applicant: Hirose Electric Co., Ltd., Tokyo (JP)

(72) Inventors: Tadashi Sakaizawa, Tokyo (JP); Akihiro Kodama, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 95 days.

(21) Appl. No.: 13/868,239

(22) Filed: Apr. 23, 2013

(65) Prior Publication Data

US 2013/0288528 A1 Oct. 31, 2013

(30) Foreign Application Priority Data

Apr. 25, 2012 (JP) ................. 2012-099567

(51) Int. Cl.
| | |
|---|---|
| *H01R 31/08* | (2006.01) |
| *H01R 31/02* | (2006.01) |
| *H01R 24/66* | (2011.01) |
| *H01R 13/518* | (2006.01) |
| *H01R 13/74* | (2006.01) |
| *H05K 7/14* | (2006.01) |

(52) U.S. Cl.
CPC .............. *H01R 24/66* (2013.01); *H01R 13/518* (2013.01); *H01R 13/748* (2013.01); *H05K 7/1457* (2013.01)

(58) Field of Classification Search
CPC ........ H01R 31/08; H01R 31/02; H01R 31/06; H01R 2201/06; H01R 11/24; H01R 13/7032; H01R 31/085
USPC .................. 439/502, 504, 507–514
See application file for complete search history.

(56) References Cited

U.S. PATENT DOCUMENTS

| | | | | |
|---|---|---|---|---|
| 1,690,118 | A * | 11/1928 | Julyan ........................ | 439/504 |
| 3,587,030 | A * | 6/1971 | Ohnsorg et al. ............. | 439/502 |
| 4,106,833 | A * | 8/1978 | Wilson et al. ............... | 439/277 |
| 4,162,815 | A * | 7/1979 | Fleischhacker ............. | 439/509 |
| 4,508,403 | A * | 4/1985 | Weltman et al. ............ | 439/502 |
| 4,541,677 | A * | 9/1985 | Logan et al. ................ | 439/77 |
| 4,664,459 | A * | 5/1987 | Flanagan et al. ............ | 439/502 |
| 4,813,880 | A * | 3/1989 | Kramer et al. ............... | 439/65 |
| 4,945,872 | A * | 8/1990 | Embry ................... | 123/146.5 B |
| 5,154,646 | A * | 10/1992 | Shoup ......................... | 439/772 |

(Continued)

FOREIGN PATENT DOCUMENTS

JP 10-125301 A 5/1998

*Primary Examiner* — Gary Paumen
(74) *Attorney, Agent, or Firm* — Kubotera & Associates, LLC

(57) ABSTRACT

A connecting device is configured to be fitted into twp mating electrode connectors having power source electrodes, so that the power source electrodes are electrically connected. The connecting device for connecting the power source electrodes includes a housing member having an engaging portion having a recessed shape capable of engaging with the mating electrode connector. The connecting device includes a flat terminal with a flat plate shape being held with the housing member and a flexible braided wiring member connected to the flat terminal. The flexible braided wiring member is connected to a rear end portion of another flat terminal at both end portions thereof. The flat terminals at the both end portions of the flexible braided wiring member are held at middle portions thereof with separate housing members. Both surfaces of a front end portion of the flat terminal are exposed in the engaging portion of the housing member.

16 Claims, 4 Drawing Sheets

(56) References Cited

U.S. PATENT DOCUMENTS

| | | | |
|---|---|---|---|
| 5,229,543 A * | 7/1993 | Strefling | 174/15.6 |
| 6,837,728 B2 * | 1/2005 | Miyazaki et al. | 439/271 |
| 7,322,849 B2 * | 1/2008 | Sutton | 439/502 |
| 8,545,265 B2 * | 10/2013 | Sakamoto et al. | 439/606 |
| 8,585,421 B2 * | 11/2013 | Yamaguchi et al. | 439/248 |
| 2012/0015546 A1 * | 1/2012 | Yamaguchi et al. | 439/370 |
| 2013/0040488 A1 * | 2/2013 | Nakamura | 439/509 |
| 2013/0171872 A1 * | 7/2013 | Kanda et al. | 439/607.41 |

* cited by examiner

CONNECTING DEVICE

BACKGROUND OF THE INVENTION AND RELATED ART STATEMENT

The present invention relates to a connecting device. More specifically, the present invention relates to a connecting device for connecting power source electrodes.

In general, in order to increase a capacity of a power source, a plurality of power sources is connected at power source electrodes thereof. Patent Reference has disclosed a conventional connecting device for connecting electrode posts of a plurality of batteries configured as the power source. The conventional connecting device disclosed in Patent Reference includes a flexible conductive member with a short band shape and a connecting member with an L character shape fixed to both end portions of the flexible conductive member. The connecting member has a connecting hole. When the conventional connecting device is attached, the connecting member is positioned such that the electrode post passes through the connecting hole. Then, a nut is fitted on the electrode post protruding from the connecting hole to fix the connecting member to the electrode post. Finally, the flexible connective member is disposed to connect the electrode posts with the connecting member fixed thereto.

Patent Reference: Japanese Patent Publication No. 10-125301

In the conventional connecting device disclosed in Patent Reference for connecting the electrode posts disposed in the battery, when the electrode posts are shifted with each other, it is configured such that the flexible conductive member of the conventional connecting device follows the shift, thereby making it possible to easily deal with the shift of the electrode posts.

In the conventional connecting device disclosed in Patent Reference, however, it is necessary to pass the electrode post of the battery through the connecting hole, and further tighten the nut on the electrode post. In other words, it is necessary to use the nut as a separate component. In general, in order to increase the capacity of the power source, a large number of the batteries are connected at the power source electrodes thereof. Accordingly, it is difficult to efficiently connect the batteries.

As other measure to increase the capacity of the power source, a plurality of batteries is connected as a unit, and the unit is provided with a mating electrode connector. Accordingly, it is possible to connect a plurality of the units, thereby increasing the capacity of the power source. In this case, it is necessary to connect the conventional connecting device to the mating electrode connector of the unit. However, with the configuration of the mating conventional connecting device disclosed in Patent Reference, it is difficult to collectively connect the units.

In view of the problems described above, an object of the present invention is to provide a connecting device for connecting power source electrodes. In the connecting device of the present invention, it is possible to easily connect the power source electrodes through a relatively simple operation and a small number of components while being capable of dealing with a shift of the power source electrodes of the mating electrode connector disposed in the units of the power source.

Further objects and advantages of the invention will be apparent from the following description of the invention.

SUMMARY OF THE INVENTION

In order to attain the objects described above, according to a first aspect of the present invention, a connecting device is configured to be fitted into twp mating electrode connectors having power source electrodes, so that the power source electrodes are electrically connected.

According to the first aspect of the present invention, the connecting device for connecting the power source electrodes includes a housing member having an engaging portion having a recessed shape capable of engaging with the mating electrode connector. Further, the connecting device includes a flat terminal with a flat plate shape being held with the housing member and a flexible braided wiring member connected to the flat terminal.

According to the first aspect of the present invention, the flexible braided wiring member is connected to a rear end portion of another flat terminal at both end portions thereof. The flat terminals at the both end portions of the flexible braided wiring member are held at middle portions thereof with separate housing members. Both surfaces of a front end portion of the flat terminal are exposed in the engaging portion of the housing member.

According to the first aspect of the present invention, the engaging portion is formed in the housing member of the connecting device for connecting the power source electrodes. When the mating electrode connector is fitted in the engaging portion, the connecting device is fitted into the mating electrode connector, so that the flat terminal exposed in the engaging portion of the housing member is directly connected with the power source electrode of the mating electrode connector. The housing members are disposed on the both end portions of the braided wiring member. Accordingly, when the housing members are connected to the mating power source connectors of two separate power sources as described above, the two separate power sources are connected. Even if the mating electrode connectors disposed at the two separate power sources are shifted from a standard position thereof, the braided wiring member with flexibility is capable of absorbing the positional shift of the mating electrode connectors.

According to a second aspect of the present invention, in the connecting device according to the first aspect, the housing member may be configured such that the housing member is capable of being attached to an attachment hole of a panel, in which the attachment hole is formed in the panel at a position corresponding to the mating electrode connector. Accordingly, it is possible to attach the housing member to the panel such that the housing member is capable of freely shifting in a direction parallel to a plate surface of the panel among the directions parallel to and perpendicular to the plate surface of the panel.

According to the second aspect of the present invention, when the panel is positioned and attached to a component, on which a plurality of the mating electrode connectors is collectively supported, it is possible to collectively attach a plurality of the housing members to a plurality of the mating electrode connectors in a state that each of a plurality of the housing members corresponds to each of a plurality of the mating electrode connectors. At this moment, it is configured such that the housing member is capable of freely shifting in the direction parallel to the panel. Accordingly, it is possible to absorb the positional shift of the housing member relative to a standard position of the mating electrode connector within the freedom range described above.

According to a third aspect of the present invention, in the connecting device according to the first aspect, the flat terminal may be held with a holding member formed of an electrically insulation material. The holding member is capable of being held with the housing member. Further, the housing member includes a fitting hole for fitting the holding member.

According to the third aspect of the present invention, the holding member holds the flat terminal. Accordingly, when the flat terminal is attached to the housing member, it is possible to easily attach the flat terminal through holding the holding member formed of the electrically insulation material. Further, when the housing member is attached to the panel, the housing member can be attached to the panel in advance. Afterward, the holding member is attached to the fitting hole of the housing member, thereby improving the operability.

According to a fourth aspect of the present invention, in the connecting device according to the first aspect, the braided wiring member may be preferably covered with an insulation tube having flexibility. When the braided wiring member is covered with an insulation tube, it is possible to prevent mutual contact of the braided wiring members or external inadvertent contact of the conductive component of the braided wiring member during the connecting operation or in use.

According to the fourth aspect of the present invention, the insulation tube has flexibility so that the insulation tube does not interfere with flexibility of the braided wiring member. Therefore, it is preferred that the insulation tube is formed of a soft material or a space is provided between the braided wiring member and the insulation tube.

As described above, according to the present invention, in the connecting device for connecting the power source electrodes, the both end portions of the braided wiring member are connected to the separate flat terminals, respectively. The flat terminals are held with the corresponding separate housing members, respectively. Accordingly, as opposed to the conventional connecting device, in which the nut is used, it is possible to reduce the number of the components. Further, the flat terminal directly contacts with the power source electrode of the mating electrode connector through simply attaching the housing member to the mating electrode connector of the power source, thereby making the operation simple. Further, it is possible to connect the connecting device to the mating electrode connector not only in the case that the power source is formed of a plurality of batteries in a unit, but also in other type of battery as far as the battery has the mating electrodes.

BRIEF DESCRIPTION OF THE DRAWINGS

FIGS. 2(A) and 2(B) are perspective views showing the connecting device according to the embodiment of the present invention, wherein FIG. 2(A) is a perspective view showing the connecting device before a holding member holding a flat terminal, to which a braided wiring member is connected, is attached to a housing member, and FIG. 2(B) is a perspective view showing the connecting device after the holding member is attached to the housing member;

FIGS. 3(A) to 3(C) are perspective views showing the flat terminal of the connecting device according to the embodiment of the present invention, wherein FIG. 3(A) is a perspective view showing the flat terminal, to which the braided wiring member is connected, FIG. 3(B) is a perspective view showing the flat terminal before the holding member is attached to the flat terminal, and FIG. 3(C) is a perspective view showing the connecting device after the holding member is attached to the flat terminal; and FIGS. 4(A) and 4(B) are sectional views showing the housing member of the connecting device in a state that the holding member is attached to the housing member and the housing member is attached to a panel according to the embodiment of the present invention, wherein FIG. 4(A) is a sectional view showing the housing member taken along a line where the flat terminal is situated, and FIG. 4(B) is a sectional view showing the housing member taken along a line where an attachment screw is situated.

DETAILED DESCRIPTION OF THE PREFERRED EMBODIMENTS

Figure 1:
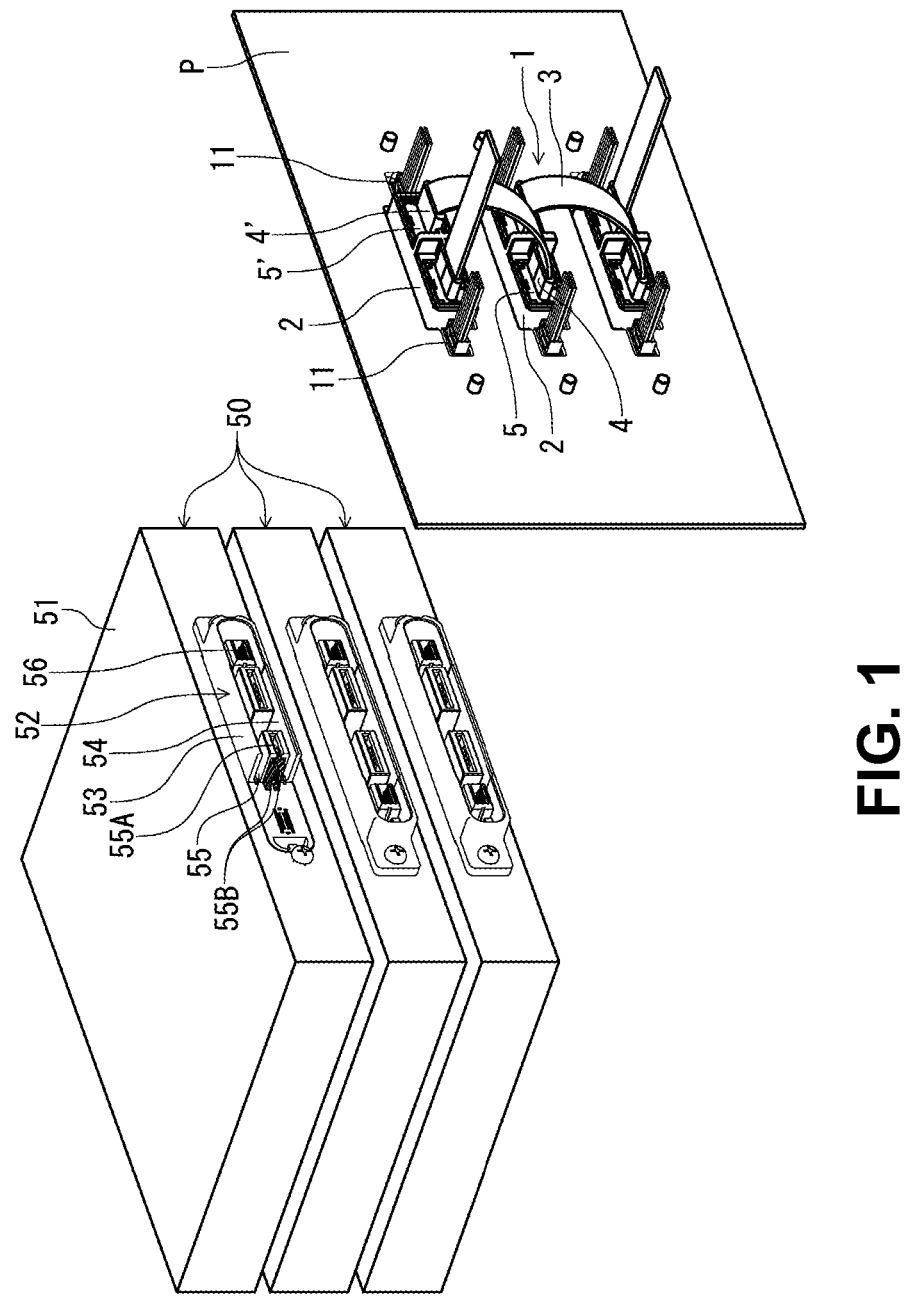
FIG. 1 is a partially sectional perspective view showing a connecting device and a power source unit according to an embodiment of the present invention.

Hereunder, embodiments of the present invention will be explained with reference to the accompanying drawings. In the accompanying drawings, similar components are designated with the same reference numerals, and repeated explanations thereof are omitted.

FIG. 1 is a partially sectional perspective view showing a connecting device 1 and a power source unit 50 according to an embodiment of the present invention.

In the power source unit 50, a plurality of batteries connected with each other is disposed in a unit casing 51. An electrode connector 52 having a power source electrode 55B (described later in more detail) is arranged to expose from a front surface of the unit casing 51. In the embodiment shown in FIG. 1, the power source unit 50 is arranged in three stages, and a larger number of the power source units 50 may be arranged in an actual application.

In the embodiment, all of the power source units 50 are integrally supported with a frame member (not shown), and the electrode connector 52 disposed on each of the power source units 50 is arranged on the front surface of the unit casing 51, so that the electrode connectors 52 can be connected with each other. Further, the electrode connector 52 has a receptacle recessed portion 54 opening toward a front side thereof for connecting the connecting device 1 (described later in more detail). Further, the electrode connector 52 has engaging protruding portions 55 arranged in the receptacle recessed portion 54.

As shown in FIG. 1, the power source unit 50 arranged at the upper most location has a housing 53, which is partially sectioned. As shown in the partial sectional view of the housing 53 and the engaging protruding portions 55, each of the engaging protruding portions 55 includes an engaging slit 55A, and the power source electrode 55B is disposed in the engaging slit 55A.

As shown in FIG. 1, the power source electrode 55B is formed of three small pieces paired in a vertical direction. Each of the small pieces possesses elasticity, and is arranged such that a constricted portion is formed between the small pieces arranged in the vertical direction. Accordingly, when the connecting device 1 is inserted into the electrode connector 52, the constricted portion sandwiches a terminal main body portion 4A of a flat terminal 4 formed in a flat plate shape (described later in more detail), so that the power source electrode 55B contacts with the flat terminal 4. Further, a control connector 56 is disposed in the receptacle recessed portion 54 on a side of the engaging protruding portion 55.

As shown in FIG. 1, the connecting device 1 is arranged on a panel P at locations corresponding to the electrode connectors 55, so that the number of the connecting devices 1 corresponds to the number of the electrode connectors 55. Accordingly, the connecting devices 1 connect the power source units 50 through the electrode connectors 55.

In the embodiment, the connecting device 1 includes a housing member 2 formed of an electrically insulation material. The housing member 2 is directly attached to the panel P. Further, the connecting device 1 includes a braided wiring member 3 with flexibility formed in a band shape; the flat terminals 4 and 4' connected to end portions of the braided wiring member 3; and holding members 5 and 5' formed of an electrically insulation material for holding the flat terminals 4 and 4', respectively. More specifically, the holding members 5 and 5' are arranged to hold middle portions of the flat terminals 4 and 4' connected to the end portions of the braided wiring member 3.

In the embodiment, the flat terminals 4 and 4' have an identical shape, and the holding members 5 and 5' may be formed in different shapes. The housing member 2 includes attachment holes 10 and 10' (refer to FIG. 2(A), described later) for receiving the holding members 5 and 5', respectively. When the holding members 5 and 5' are formed in the different shapes, the attachment holes 10 and 10' are formed in different shapes, so that the holding members 5 and 5' can be fitted into the attachment holes 10 and 10'.

As shown in FIG. 1, when the connecting device 1 is in an actual connecting state, one end portion of the braided wiring member 3 is situated on the right side of the housing member 2 of the connecting device 1 situated at the upper most position, and the other end portion of the braided wiring member 3 is situated on the left side of the housing member 2 of the connecting device 1 situated at the next lower position. As described above, the holding members 5 and 5' may be formed in different shapes. When the holding members 5 and 5' are formed in the different shapes, the left side and the right side of the housing member 2, i.e., the attachment holes 10 and 10', are formed in the different shapes. Accordingly, it is possible to securely insert the holding members 5 and 5' into the left side and the right side of the housing member 2, respectively.

As shown in FIG. 1, one of the braided wiring members 3 is situated and connects between the connecting device 1 at the upper most position and the connecting device 1 situated at the middle position. Further, the braided wiring member 3 is arranged to connect the right side of the housing member 2 of the connecting device 1 situated at the upper most position and the left side of the housing member 2 of the connecting device 1 situated at the middle position. Further, the braided wiring member 3 connected to the left side of the housing member 2 of the connecting device 1 situated at the upper most position extends to another device (not shown). Further, the braided wiring member 3 connected to the right side of the housing member 2 of the connecting device 1 situated at the middle position extends to the left side of the housing member 2 of the connecting device 1 situated at the lower most position.

Figure 2A:
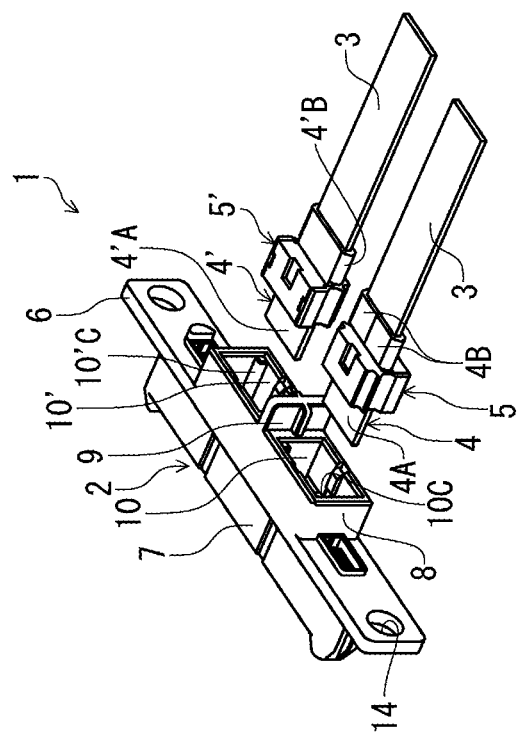
Figure 2B:
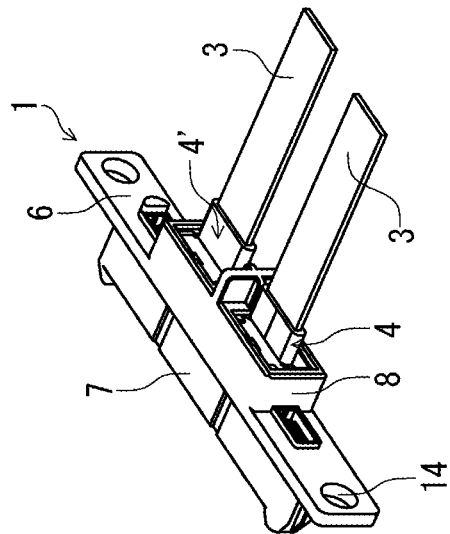

FIGS. 2(A) and 2(B) are perspective views showing the connecting device 1 according to the embodiment of the present invention. More specifically, FIG. 2(A) is a perspective view showing the connecting device 1 before the holding member 5 holding the flat terminal 4, to which the braided wiring member 3 is connected, is attached to the housing member 2, and FIG. 2(B) is a perspective view showing the connecting device 1 after the holding member 5 is attached to the housing member 2.

As shown in FIG. 2, one end portion of the braided wiring member 3 extending from another device and another end portion of another braided wiring member 3 extending from still another device are inserted into the housing member 2 of the connecting device 1 with next each other in a band surface direction of the braided wiring member 3 (a plate surface direction of the flat terminal 4). As compared with the configuration shown in FIG. 1, except the positional arrangement of the connecting device 1, the connecting state of the connecting device 1 is similar to the case that one end portion of the braided wiring member 3 is inserted into the right side thereof and another end portion of the braided wiring member 3 is inserted into the left side thereof. In other words, the connecting device 1 has the right side on the one end portion of the braided wiring member 3 and the left side on another end portion of the braided wiring member 3. Accordingly, in the following description, the connecting device 1 will be explained according to one end portion of the braided wiring member 3 inserted into the right side thereof and another end portion of the braided wiring member 3 inserted into the left side thereof.

Figure 3A:
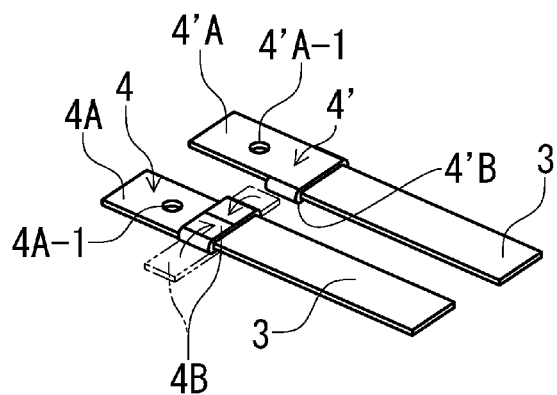
Figure 3B:
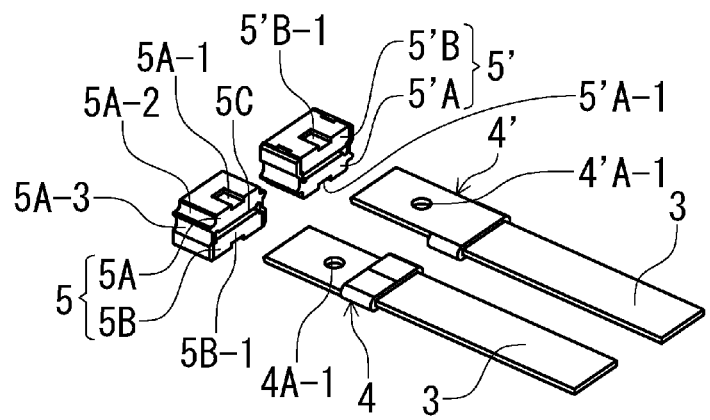
Figure 3C:
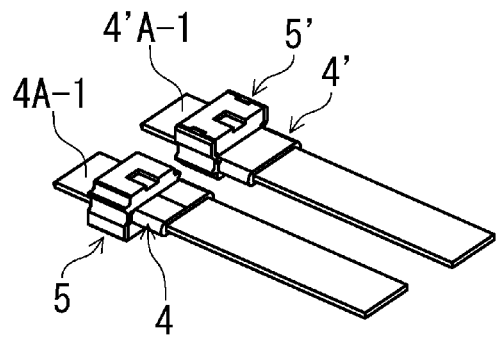

FIGS. 3(A) to 3(C) are perspective views showing the flat terminal 4 of the connecting device 1 according to the embodiment of the present invention. More specifically, FIG. 3(A) is a perspective view showing the flat terminal 4, to which the braided wiring member 3 is connected, FIG. 3(B) is a perspective view showing the flat terminal 4 before the holding member 5 is attached to the flat terminal 4, and FIG. 3(C) is a perspective view showing the connecting device 1 after the holding member 5 is attached to the flat terminal 4.

As shown in FIGS. 2(A)-2(B) and FIGS. 3(A)-3(C), the flat terminal 4 is connected to an end portion of the braided wiring member 3, and is formed through processing a metal flat plate member. Further, the flat terminal 4 includes the terminal main body portion 4A extending toward the end portion (the left side in FIG. 2(A) and FIGS. 3(A)-3(C)) and a pressing portion 4B (refer to a portion represented with a hidden line in FIG. 3(A)) extending from both side edges of the terminal main body portion 4A at a position closer to the braided wiring member 3.

As shown in FIG. 3(A), the pressing portion 4B is processed to bend in an arrow direction, so that the pressing portion 4B surrounds the end portion of the braided wiring member 3 in a flat plate shape, thereby pressing and connecting the braided wiring member 3. The terminal main body portion 4A has both front and backside surfaces of the plate member as a contact portion for contacting the power source electrode 55B of the electrode connector 52.

As shown in FIG. 3(A), a portion of the pressing portion 4B represented with a solid line shows a state after the flat terminal 4 is connected to the end portion of the braided wiring member 3. More specifically, side edge portions of the pressing portion 4B are aligned with each other on an upper side of the braided wiring member 3, so that an abutting boundary portion between the side edge portions is shown as a straight line. Further, the terminal main body portion 4A has an engaging hole 4A-1 for engaging with the holding member 5 (refer to FIGS. 3(A) and 3(B)).

As shown in FIGS. 2(A)-2(B) and FIGS. 3(A)-3(C), the flat terminal 4' has a configuration similar to that of the flat terminal 4. It should be noted that the flat terminal 4' includes a pressing portion 4'B bent toward a lower side to connect the braided wiring member 3. Accordingly, an abutting boundary portion between side edge portions of the pressing portion 4'B is situated on a lower side of the braided wiring member 3, and is not shown in FIGS. 2(A)-2(B) and FIGS. 3(A)-3(C).

As shown in FIG. 3(B), the holding member 5 formed of the electrical insulation material is configured to hold the flat terminal 4. The holding member 5 on the left side is formed of an upper member 5A and a lower member 5B. As shown in FIG. 3(B), the upper member 5A is formed in a rectangular shape and has an opening portion toward a lower side. The lower member 5B is fitted in the opening portion of the upper member 5A, so that the lower member 5B is integrated with the upper member 5A to constitute the holding member 5. More specifically, the lower member 5B is combined with the upper member 5A such that the lower member 5B and the upper member 5A sandwich the terminal main body portion 4A of the flat terminal 4 from beneath and above.

As shown in FIG. 3(B), after the holding member 5 is assembled as described above, an engaging slit 5C is formed between the lower member 5B and the upper member 5A before the terminal main body portion 4A of the flat terminal 4 is not disposed between the lower member 5B and the upper member 5A. The engaging slit 5C is configured to pass through from one edge to the other edge in a front-to-back direction of the holding member 5. The engaging slit 5C has a size and an internal dimension such that it is possible to properly assemble the lower member 5B and the upper member 5A to sandwich the terminal main body portion 4A of the flat terminal 4 from beneath and above.

Figure 4A:
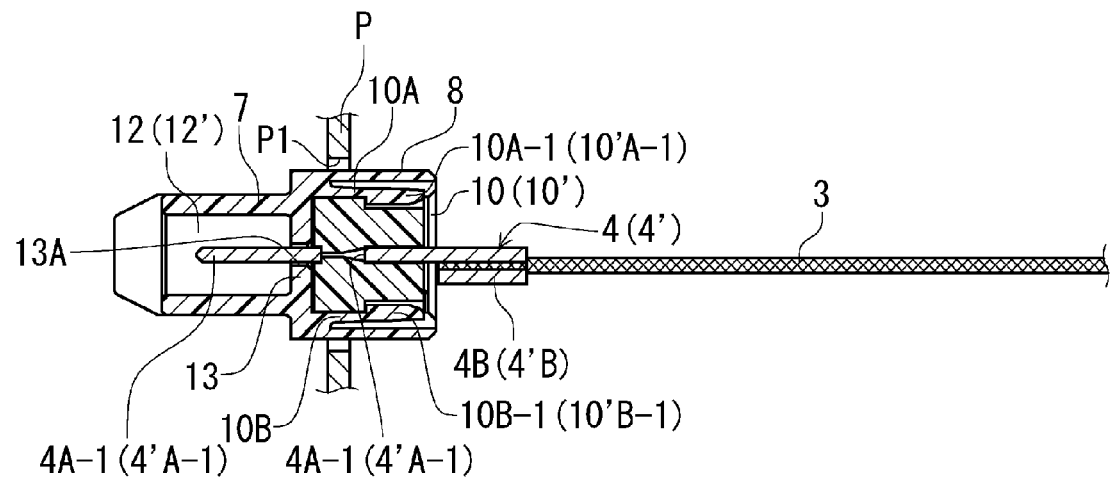

In the embodiment, the lower member 5B and the upper member 5A have engaging protrusions protruding in the engaging slit 5C, so that the engaging protrusions are fitted in the engaging hole 4A-1 of the terminal main body portion 4A (refer to FIG. 4(A)). As shown in FIG. 4(A), the engaging protrusions are configured to form a space in between. The space has a vertical distance decreasing toward the left side in FIG. 4(A). Further, the engaging protrusions are configured to form a step portion on the left side.

As shown in FIG. 3(B), the upper member 5A of the holding member 5 has an engaging groove 5A-1 in an upper surface thereof, and the lower member 5B of the holding member 5 has an engaging groove 5B-1 in a lower surface thereof. The engaging groove 5A-1 and the engaging groove 5B-1 are formed to have opening portions at right edges thereof, so that the engaging groove 5A-1 and the engaging groove 5B-1 engage with a corresponding portion of the housing member 2 (described later). The upper member 5A of the holding member 5 further has guided grooves 5A-2 on both sides thereof at an upper corner thereof. The guided grooves 5A-2 are formed to extend toward the left side and the right side. The upper member 5A of the holding member 5 further has cut grooves 5A-3 having an arc shape on both side surfaces thereof. The cut grooves 5A-3 are formed to extend toward the left side and the right side.

As shown in FIG. 2, the holding member 5' is an inverted state of the holding member 5 in the actual use. The cut grooves 5A-3 are provided for imparting flexibility to the upper member 5A to easily deform elastically at the side surface portion thereof when the lower member 5B and the upper member 5A to sandwich the terminal main body portion 4A of the flat terminal 4.

In the embodiment, the housing member 2 formed of the electrically insulation material is attached to the panel P as shown in FIG. 1. The housing member 2 includes a flange portion 6 contacting with the surface of the panel P; an engaging cylindrical portion 7 on a side opposite to the flange portion 6, that is, a side facing the electrode connector 52 as a mating component; and a fitting portion 8 penetrating through a hole portion P1 formed in the panel P (refer to FIG. 4(A)) to be situated on a side of the panel P relative to the flange portion 6. The fitting portion 8 includes a center wall portion 9 and fitting holes 10 and 10' on both left and right sides of the center wall portion 9. The fitting hole 10 is provided for receiving the holding member 5, and the fitting hole 10' is provided for receiving the holding member 5'. Accordingly, a guide protruding portion 10C is formed on an inner side surface of the fitting hole 10 for guiding the guided groove 5A-2 formed at the upper corner of the holding member 5. Further, a guide protruding portion 10'C is formed in the fitting hole 10' for guiding the guided groove 5A-2 formed at the lower corner of the holding member 5'.

In the embodiment, when the connecting device 1 is used, the braided wiring member 3 is placed in a flat band state, and the both end portions thereof are attached to the holding members 5 and 5' on the same side in the vertical direction. Then, the braided wiring member 3 is turned at the middle in a U character shape. Accordingly, it is possible to securely insert the holding member 5 into the fitting hole 10 with the guide protruding portion 10C formed on the upper corner thereof, and the holding member 5' into the fitting hole 10' with the guide protruding portion 10'C formed on the lower corner thereof.

Figure 4B:
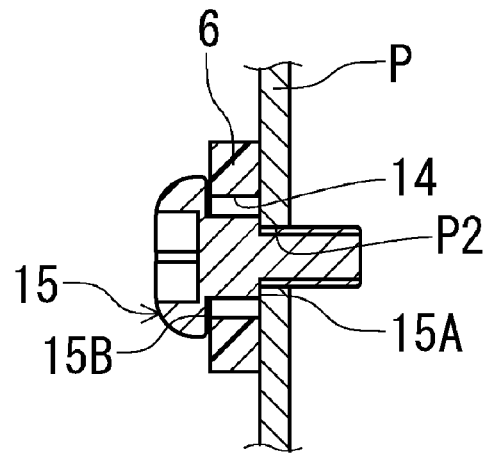

FIGS. 4(A) and 4(B) are sectional views showing the housing member 2 of the connecting device 1 in a state that the holding member 5 is attached to the housing member 2 and the housing member 2 is attached to the panel P according to the embodiment of the present invention. More specifically, FIG. 4(A) is a sectional view showing the housing member 2 taken along a line where the flat terminal 4 is situated, and FIG. 4(B) is a sectional view showing the housing member 2 taken along a line where an attachment screw 15 is situated.

As shown in FIG. 4(A), the fitting hole 10 further includes elastic arm portions 10A and 10B on an upper inner surface and a lower inner surface thereof (the fitting hole 10' is similar to the fitting hole 10). The elastic arm portions 10A and 10B are formed through partially cutting through an upper wall portion and a lower wall portion such that a slit is formed to have an opening portion on the side of the opening portion of the fitting hole 10. Accordingly, the elastic arm portions 10A and 10B are formed in a cantilever shape extending toward the opening portion.

In the embodiment, the elastic arm portions 10A and 10B are formed in a size suitable to the engaging grooves 5A-1 and 5B-1 formed at the upper portion and the lower portion of the holding member. Further, the elastic arm portions 10A and 10B includes an engaging claw portions 10A-1 and 10B-1, respectively, for engaging with groove side walls of the engaging grooves 5A-1 and 5B-1. Accordingly, when the holding member 5 is inserted into the fitting hole 10, the holding member 5 abuts against the engaging claw portions 10A-1 and 10B-1 at a distal end portion thereof in an insertion direction. As a result, the elastic arm portions 10A and 10B are deformed upwardly and downwardly, respectively, so that the holding member 5 can be inserted further and reach a specific position (until a front surface of the holding member 5 contacts with a backside wall of the fitting hole 10).

In the embodiment, after the holding member 5 reaches the specific position, the elastic arm portions 10A and 10B are released from the deformed state. Accordingly, the engaging claw portions 10A-1 and 10B-1 enter the engaging grooves 5A-1 and 5B-1, so that the engaging claw portions 10A-1 and 10B-1 engage with the engaging grooves 5A-1 and 5B-1, thereby preventing the holding member 5 from coming off. Similarly, the holding member 5' is inserted into the fitting hole 10' having the similar configuration, thereby preventing the holding member 5' from coming off.

In the embodiment, a control connector portion 11 is disposed on both sides of the fitting portion 8 (refer to FIG. 1). The control connector portion 11 is provided for transmitting a control signal when the power source unit 50 is connected. A detailed explanation of the control connector portion 11 is omitted.

As shown in FIGS. 2(A)-2(B) and FIG. 4(A), the housing member 2 includes the engaging cylindrical portion 7 on the side opposite to the panel P, and the engaging cylindrical portion 7 is formed in an outer shape corresponding to the receptacle recessed portion 54 of the electrode connector 52.

As shown in FIG. 4(A), the engaging cylindrical portion 7 includes engaging portions 12 and 12' formed in a recess shape and arranged next each other for receiving the engaging protruding portions 55 of the electrode connectors 52. It should be noted that only the engaging portion 12 is presented in FIG. 4(A), and the engaging portion 12' is arranged next to the engaging portion 12. The engaging portions 12 and 12' are disposed adjacent to the fitting holes 10 and 10' such that the backside walls of the fitting holes 10 and 10' become middle wall portions 13 and 13' of the engaging portions 12 and 12'.

In the embodiment, the middle wall portions 13 and 13' have through holes 13A and 13'A. When the holding members 5 and 5' holding the flat terminals 4 and 4' are inserted into the fitting holes 10 and 10', the terminal main body portions 4A and 4'A protruding from the holding members 5 and 5' pass through the through holes 13A and 13'A, so that the terminal main body portions 4A and 4'A are exposed in the engaging portions 12 and 12' with the recess shape. The control connector portion 11 is arranged to protrude in the engaging cylindrical portion 7 on the both sides of the engaging portions 12 and 12', so that the control connector portion 11 can be fitted into the control connector 56 of the electrode connector 52.

As shown in FIGS. 2(A)-2(B) and 4(B), the flange portion 6 of the housing member 2 includes a hole portion 14 for inserting the attachment screw 15 to attach the housing member 2 to the panel P. The hole portion 14 has an inner diameter larger than an outer diameter of a crew portion of the attachment screw 15. Further, as shown in FIG. 4(A), the hole portion P1 for attaching the fitting portion 8 of the housing member 2 has a dimension slightly larger than an outer dimension of the fitting portion 8. Accordingly, after the attachment screw 15 is inserted into the hole portion 14 of the flange portion 6, when the attachment screw 15 engages with a screw hole P2 of the panel P, there are gaps between the attachment screw 15 and the hole portion 14, and between the outer surface of the fitting portion 8 of the housing member 2 and the screw hole P1 of the panel P, respectively. As a result, the housing member 2 is attached such that the housing member 2 is capable of freely shifting within the gaps in a direction in parallel to the surface of the panel P.

In the embodiment, the attachment screw 15 includes a step portion 15A for abutting against the surface of the panel P. Further, the attachment screw 15 is configured such that a distance between the step portion 15A and a screw head portion 15B is slightly greater than a thickness of the flange portion 6 of the housing member 2. Accordingly, the flange portion 6, that is the housing member 2, is configured such that the flange portion 6 is capable of freely shifting in a direction perpendicular to the surface of the panel P as well. As a result, the housing member 2 is capable of freely shifting in both directions in parallel and perpendicular to the surface of the panel P. In other words, it is possible to float the housing member 2 within the freedom of shifting.

An operation of producing and using the connecting device 1 will be explained next. First, the braided wiring member 3 and the flat terminal 4 in the state before bending are prepared. In the next step, as shown in FIG. 3(A), the pressing portion 4B of the flat terminal 4 is bent from the state presented with the hidden line to the state represented with the solid line, so that the one end portion of the braided wiring member 3 is tightly fitted to the flat terminal 4. Further, the flat terminal 4' as the other flat terminal is attached to the other end portion of the braided wiring member 3 in the same way.

In the next step, after the one end portion and the other end portion of the braided wiring member 3 are fitted to the flat terminal 4 and the flat terminal 4', the flat terminal 4 and the flat terminal 4' are assembled into the gaps between the upper member 5A and the lower member 5B of the holding member 5 and the upper member 5'A and the lower member 5'B of the holding member 5', respectively. More specifically, as shown in FIG. 3(B), the one end portion of the flat terminal 4, where the abutting boundary portion between the side edge portions of the pressing portion 4B is shown upside, is attached to the holding member 5. Further, the other end portion of the flat terminal 4', where the abutting boundary portion between the side edge portions of the pressing portion 4'B faces downward, is attached to the holding member 5'. Further, the engaging protrusions formed inside the engaging slits 5C and 5'C of the holding members 5 and 5' engage with the engaging holes 4A-1 and 4'A-1, respectively. Accordingly, it is possible to prevent the flat terminal 4 and the flat terminal 4' from coming off the holding member 5 and the holding member 5'.

In the next step, afterward, or along with the operation described above, the housing member 2 is attached to the panel P. More specifically, after the attachment screw 15 is inserted into the hole portion 14 of the flange portion 6 of the housing member 2, the attachment screw 15 is screwed into the screw hole P2 of the panel P, so that the housing member 2 is attached to the panel P. As described above, the housing member 2 is attached such that the housing member 2 is capable of freely shifting in both directions in parallel and perpendicular to the surface of the panel P. Accordingly, it is possible to float the housing member 2 within the freedom of shifting.

In the next step, the braided wiring member 3 attached to the flat terminal 4 and the flat terminal 4' is connected to the housing member 2. More specifically, after the one end portion of the braided wiring member 3 is attached to the flat terminal 4, the flat terminal 4 is attached to the holding member 5. After the other end portion of the braided wiring member 3 is attached to the flat terminal 4', the flat terminal 4' is attached to the holding member 5'. Then, as shown in FIG. 1, the holding member 5' attached to the one end portion of the braided wiring member 3 is fitted into the fitting hole 10' on the right side of the housing member 2 disposed at the upper most position. Then, the holding member 5 attached to the other end portion of the braided wiring member 3 is fitted into the fitting hole 10 on the left side of the housing member 2 disposed at the second stage position. Similarly, the holding member 5' attached to the one end portion of the braided wiring member 3 as another braided wiring member is fitted into the fitting hole 10' on the right side of the housing member 2 disposed at the second stage position. Then, the holding member 5 attached to the other end portion of the braided wiring member 3 as another braided wiring member is fitted into the fitting hole 10 on the left side of the housing member 2 disposed at the third stage position.

As shown in FIG. 1, the braided wiring member 3 in the band shape extends from the fitting portion 8 of the housing member 2 in the backside direction, and is turned in the substantially U character shape in the plane direction of the band shape, so that the braided wiring member 3 is connected to the fitting portion 8 of the housing member 2 at the different position. Accordingly, it is possible to attain the floating movement between the housing member 2 and the housing member 2 at the different position in the vertical direction. After the braided wiring member 3 is connected to the housing members 2 at all positions in FIG. 1, the fitting hole 10 on the left side of the housing member 2 at the upper most position and the fitting hole 10' on the right side of the housing member 2 at the lower most position remain unattached to the braided wiring member 3.

In the next step, the braided wiring member 3 as other braided wiring member connected to one electrode of the device that uses the power source device is attached to the fitting hole 10 on the left side of the housing member 2 at the upper most position. Similarly, the braided wiring member 3 as still other braided wiring member connected to the other electrode of the device that uses the power source device is attached to the fitting hole 10' on the right side of the housing member 2 at the lower most position, thereby completing the connecting operation. Preferably, the braided wiring member 3 as other braided wiring member and the braided wiring member 3 as still other braided wiring member are preferably connected to the holding member 5 and the holding member 5' holding the flat terminal 4 and the flat terminal 4' described above.

After the connecting operation described above, a plurality of or an arbitrary number of the power source units 50 are moved to a specific position along a rail and the like (not shown), so that the power source units 50 are attached to the panel P. Accordingly, the electrode connector 52 of the power source unit 50 is positioned to the engaging position relative to the housing member 2 supported on the panel P. When the power source unit 50 is moved further in the fitting direction, the housing 53 is fitted into the housing member 2, so that the engaging protruding portion 55 situated inside the housing 53 is fitted into the engaging portion 12 and the engaging portion 12' with the recessed shape of the housing member 2.

In the embodiment, as described above, the terminal main body portions 4A and 4'A of the flat terminals 4 and 4' protrude from the holding members 5 and 5' attached to the fitting holes 10 and 10', respectively. Accordingly, the terminal main body portions 4A and 4'A of the flat terminals 4 and 4' enter the engaging slits 55A of the engaging protruding portions 55 of the electrode connectors 52 inserted into the engaging portions 12 and 12' of the housing members. As a result, the terminal main body portions 4A and 4'A of the flat terminals 4 and 4' are electrically connected to the power source electrodes 55B situated inside the engaging slits 55A.

It should be noted that the housing 53 of the electrode connector 52 is not necessarily situated at the position exactly corresponding to the housing member 2 on the panel P before the electrode connector 52 is fitted to the housing member 2. AS described above, the housing member 2 is arranged to be capable of shifting relative to the panel P with the specific degree of freedom. Accordingly, as far as the housing 53 is situated within the range capable of guiding the housing member 2, it is possible to fit the electrode connector 52 to the housing member 2 through shifting the position of the housing member 2 according to the degree of freedom.

It should be noted that the present invention is not limited to the embodiment described above, and is capable to various modifications. For example, it is possible to cover the braided wiring member 3 with an insulation tube as far as the flexibility of the braided wiring member 3 is impaired. When the braided wiring member 3 is loosely covered with such a tube, it is possible to prevent the flexibility of the braided wiring member 3 from being impaired. Further, it is possible to prevent short between the braided wiring members 3 when the connecting device 1 is connected or the braided wiring members 3 are arranged close to each other. The disclosure of Japanese Patent Application No. 2012-099567 filed on Apr. 25, 2012, is incorporated in the application by reference.

While the invention has been explained with reference to the specific embodiments of the invention, the explanation is illustrative and the invention is limited only by the appended claims.

What is claimed is:

1. A connecting device to be connected to a mating connector, comprising:
   a first housing member to be attached to one single panel and having a first engaging portion;
   a second housing member to be attached to the one single panel below the first housing member, and having a second engaging portion;
   a first flat terminal disposed in the first housing member so that both surfaces thereof are exposed in the first engaging portion;
   a second flat terminal disposed in the second housing member so that both surfaces thereof are exposed in the second engaging portion; and
   a braided wiring member having one end portion connected to the first flat terminal and the other end portion connected to the second flat terminal so that the braided wiring member is curved in a U-character shape;
   wherein said one single panel has an attachment hole corresponding to the mating connector so that the first housing member is able shifting in parallel to the one single panel.

2. The connecting device according to claim 1, further comprising a first holding member disposed in the first housing member for holding the first flat terminal and a second holding member disposed in the second housing member for holding the second flat terminal,
   wherein said first holding member includes a first upper portion and a first lower portion having a shape different from that of the first upper portion,
   said first portion faces upward in the first housing member,
   said second holding member includes a second upper portion having a shape similar to that of the first upper portion and a second lower portion having a shape similar to that of the first lower portion, and
   said second lower portion faces upward in the second housing member.

3. The connecting device according to claim 2, wherein said first housing member has a fitting portion for fitting the first holding member.

4. The connecting device according to claim 1, wherein said braided wiring member is covered with an insulation tube.

5. The connecting device according to claim 1, wherein said first housing member is formed in a shape substantially the same as that of the second housing member.

6. The connecting device according to claim 1, wherein said first flat terminal is formed in a shape substantially the same as that of the second flat terminal.

7. The connecting device according to claim 1, wherein said first housing member includes a first right side opening portion and a first left side opening portion arranged laterally so that the first flat terminal is retained in the first right side opening portion,
   said second housing member includes a second right side opening portion and a second left side opening portion arranged laterally so that the second flat terminal is retained in the second left side opening portion, and
   said braided wiring member extends obliquely between the first right side opening portion and the second left side opening portion.

8. A connecting device to be connected to a first mating connector and a second mating connector, comprising:
   one single panel;
   a first housing member attached to the one single panel and having a first engaging portion;

a second housing member attached to the one single panel adjacent to the first housing member, and having a second engaging portion;
a first flat terminal disposed in the first housing member so that both surfaces thereof are exposed in the first engaging portion;
a second flat terminal disposed in the second housing member so that both surfaces thereof are exposed in the second engaging portion; and
a braided wiring member having one end portion connected to the first flat terminal and the other end portion connected to the second flat terminal so that the braided wiring member is curved in a U-character shape,
wherein said one single panel has a first attachment hole corresponding to the first mating connector so that the first housing member is capable of shifting in parallel to the one single panel, and
said one single panel has a second attachment hole corresponding to the second mating connector so that the second housing member is capable of shifting in parallel to the one single panel.

9. The connecting device according to claim 8, further comprising a first holding member disposed in the first housing member for holding the first flat terminal and a second holding member disposed in the second housing member for holding the second flat terminal,
wherein said first holding member includes a first upper portion and a first lower portion having a shape different from that of the first upper portion,
said first upper portion faces upward in the first housing member,
said second holding member includes a second upper portion having a shape similar to that of the first upper portion and a second lower portion having a shape similar to that of the first lower portion, and
said second lower portion faces upward in the second housing member.

10. The connecting device according to claim 9, wherein said first housing member has a fitting portion for fitting the first holding member.

11. The connecting device according to claim 8, wherein said braided wiring member is covered with an insulation tube.

12. The connecting device according to claim 8, wherein said first housing member is formed in a shape substantially the same as that of the second housing member.

13. The connecting device according to claim 8, wherein said first flat terminal is formed in a shape substantially the same as that of the second flat terminal.

14. The connecting device according to claim 8, wherein said first holding member is formed in a shape substantially the same as that of the second holding member.

15. The connecting device according to claim 8, wherein said first housing member is disposed above the second housing member.

16. The connecting device according to claim 8, wherein said first housing member includes a first right side opening portion and a first left side opening portion arranged laterally so that the first flat terminal is retained in the first right side opening portion,
said second housing member includes a second right side opening portion and a second left side opening portion arranged laterally so that the second flat terminal is retained in the second left side opening portion, and
said braided wiring member extends obliquely between the first right side opening portion and the second left side opening portion.

* * * * *